United States Patent [19]

Mais

[11] Patent Number: 5,015,557
[45] Date of Patent: May 14, 1991

[54] SILK SCREEN PROCESS

[76] Inventor: Ralph G. Mais, 1891 N.W. 36th St., Ft. Lauderdale, Fla. 33309

[21] Appl. No.: 407,053

[22] Filed: Sep. 14, 1989

[51] Int. Cl.$^5$ .............................................. G03F 7/12
[52] U.S. Cl. ...................................... 430/308; 430/18; 430/256; 430/258; 430/309
[58] Field of Search .................. 430/18, 256, 258, 308, 430/309; 427/143; 101/128.21, 128.4, 129

[56] References Cited

U.S. PATENT DOCUMENTS

| | | | |
|---|---|---|---|
| 4,176,602 | 12/1979 | Fedderson | 430/308 |
| 4,286,518 | 9/1981 | Otthofer, Jr. | 430/308 |
| 4,499,175 | 2/1985 | Curtis et al. | 430/308 |

Primary Examiner—Charles L. Powers, Jr.
Assistant Examiner—J. Weddington
Attorney, Agent, or Firm—Oltman and Flynn

[57] ABSTRACT

A method for coating a printing screen with a sealer to avoid pinholing and damage to the screen from extended use. The method includes coating the inside of the screen with a photo emulsion, exposing the emulsion to the image to be printed, and etching out the exposed screen. Next, applying to the outside surface of the etched out screen a sheet of easy removable pressure sensitive vinyl, and next treating the etched out screen with a sealing composition, which provides a protective barrier for that part of the screen that prevents ink from printing. The sealing composition is advantageously a two part epoxy resin or an air-moisture curing urethane polymer.

4 Claims, 1 Drawing Sheet

SILK SCREEN PROCESS

The invention relates to Screen printing and more particularly to a method for sealing a printing screen against pinholding and a sealing composition for sealing the screen.

BACKGROUND AND PRIOR ART

Screen printing as a printing process is widely used in repetitive printing of images on many types of media such as paper, fabric, ceramics, and so forth, and is applicable to printing with inks of many types, ranging from coloring dyes to inks containing reflecting beads and metallic powders having controlled electrical characteristics, and many other ingredients serving specific purposes.

In conventional screen printing, one of the most annoying and costly occurences in long run screen printing production is the "pinholding (i.e. forming of pinholes)" and the ultimate breakdown of the screen stencil.

This most frequently occurs when water based inks are used with water base photo emulsion screens. It also occurs with screens that are frequently washed up and inventoried for use at a later date. Nothing damages a screen stencil more than the washup process used for removing remaining ink before storing the stencil for future use.

On multi-thousand runs using water based inks, the emulsion starts to pinhole (i.e. form pinholes) and generally break down after a limited number of printing cycles due to wear on the screen and from the frequent washing after each printing run. This means production must stop while the stencil is temporarily retouched or possibly remade.

The method and composition according to the instant invention eliminates this costly occurrence. This system as disclosed can be used with all photo stencil methods, and preferably with the direct or the indirect method of the direct-indirect method, and other photo stencil preparation methods.

It is accordingly an object of the instant invention to provide a method of overcoming the problem of pinholing in screen stencils after prolonged use and to provide a sealing composition to be used for the method.

SUMMARY OF THE INVENTION

In its most basic form the method includes the following steps:
coating the inside of a printing screen with photo emulsion and optionally also the outside;
next exposing the emulsion to a light source as commonly used in screen printing from an image to be printed, and etching out the exposed screen;
next applying to the outside surface of the etched out screen a sheet of easy removable pressure-sensitive vinyl at least over the image area;
next coating the inside of the etched out screen with a suitable sealing composition which provides a protective barrier for that part of the stencil that prevents ink from printing.
next peeling off the aforesaid pressure-sensitive vinyl sheet from the screen, immediately after the coating has been applied and finally treating the image area with a vinyl retarding liquid to prevent the coating from converting.

According to a further feature, the method includes the step of moistening a soft link-free padded cloth with the vinyl retarder and rubbing the cloth over the image area, for removing remaining vinyl residues, and repeating the process until the image area is clear.

According to a still further feature, the method includes, after treating the image area with vinyl retarder, blowing out the image area with compressed air, advantageously using an air nozzle with a small orifice.

The method may further include: placing the screen in a substantially horizontal position for at least 24 hours for curing of said sealing composition. The sealing composition for sealing the printing screen may include a one part air/moisture, curing which is red in color for better visibility, urethane prepolymer, or a two-part epoxy resin mixture, including a resin and a curing agent.

The sealing composition of the two part resin according to the invention may advantageously include a blue dye added to one of the parts, and a yellow dye added to the other part, said blue and yellow dyes operate to give the mixture a homogeneous green color, when completely mixed together in the proper ratio.

The method according to the invention may further include the step of removing excess sealing composition from the screen, after it has been first applied to the screen. Extra material may be spread on the inside of the frame toward the edges to avoid ink leakage.

Further objects and advantages of this invention will be apparent from the following detailed description of a presently preferred embodiment which is illustrated schematically in the accompanying drawings.

DESCRIPTION OF THE PREFERRED EMBODIMENTS

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

Figure 1:
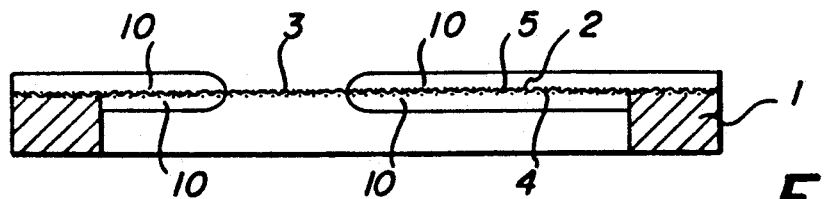
FIG. 1 is an elevational diagrammatic cross-sectional view of the invention with part of the wall broken away to show the interior construction of a photo screen stencil
Figure 2:
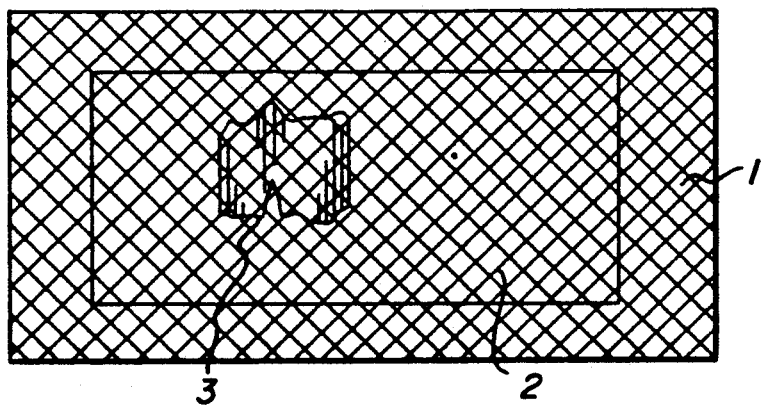
FIG. 2 is a top-down plan diagrammatic view of the invention showing a screen with an image area.

In FIGS. 1 and 2 a printing screen has a frame 1, made of any suitable dimensionally stable material such as wood, metal or plastic. A screen mesh 2 of sufficient fineness to render an image with adequate detail is attached along its perimeter to the frame by suitable means, such as staples, adhesive or any other suitable means.

The screen mesh 2 may be made of organdy, nylon, polyester, metal wires or natural fabrics such as silk, or any other material of sufficient strength and abrasion resistance to endure repeated cycles of use.

Before use, a photo emulsion coating is deposited on the entire screen, which is next exposed to light through the image to be printed. After exposure the exposed emulsion is treated with warm water or a suitable solvent, which dissolves image areas that are to receive ink.

The image area 3, shown as an example, consists of an area 3 which is void of a coating layer 10 that permits ink to be pressed through the mesh in the image area, since the ink can flow unimpeded through the mesh in any uncoated area. The art of silk screening per se is well known and has long been used in printing on multitudes of different material, and need not be described in detail, since the invention is not directed to screen printing per se, but to treating a screen image such as to attain vastly increased durability in the face hard use requiring many cycles of printing even with inks of gritty or abrasive texture. A publication written by applicant, entitled "screen making" copyrighted 1985 describes in detail the process of preparing and using printing screens. Briefly stated, the screen of FIGS. 1 and 2 has an outside surface 5 and an inside surface 4.

In use, the screen is placed with its outside surface 5 against an object to be printed, and ink is applied from the inside surface 4 with a squeeggee which drives ink onto the object through the screen mesh in the areas where no emulsion is present on the mesh.

After completion of a printing run, the screen is washed with suitable solvents to remove all traces of ink on the screen before it is stored away until its next use.

The printing process and washing after use typically causes certain wear on the emulsion, which from time to time requires time-consuming repair to cover pinholes and worn image areas where the emulsion bridges the space between the threads of the fabric.

In order to prepare an improved printing screen, capable of withstanding a much larger number of printing cycles, the following process is herewith disclosed, with reference to FIGS. 3 a,b,c and d.

Figure 3A:
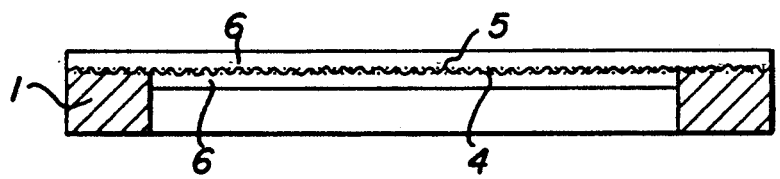
FIGS. 3 $a,b,c$ and $d$ are diagrammatic cross-sectional fragmentary enlarged views of the invention showing details of preparing the printing screen.

In FIG. 3a, the mesh 2 is coated with emulsion 6, for example, two coats 6 on the inside surface 4 (drying between coats) and one coat 6 on the outside surface 5. As many coats as desired can be put on the outside surface 5. The thicker the coating on the outside 5 of the mesh, the thicker the deposit of ink will be on the substrate to be printed.

Figure 3B:
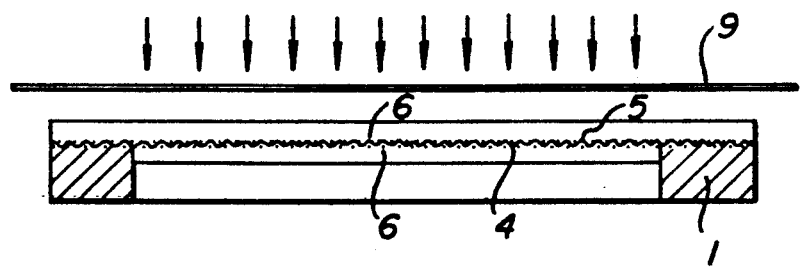
Figure 3C:
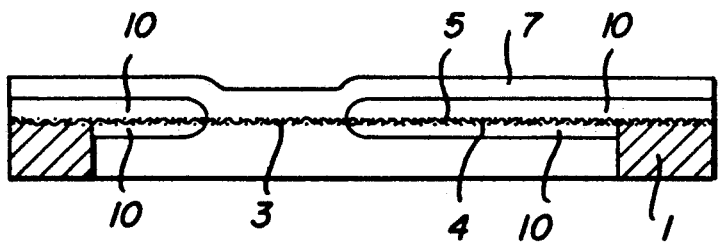

In FIG. 3b, when the emulsion is thoroughly dry, it is exposed by light shown as arrows, through an image film 9, in the usual manner, followed by etching out the image areas, and drying thoroughly and retouching pinholes with the same type emulsion, after which the screen will be as shown in FIG. 1. If necessary the emulsion is again exposed to the light source or to sunlight. In FIG. 3c a sheet 7 of easy release pressure sensitive vinyl is carefully applied, to the outside 5 of the screen, covering the image area 3, seen in FIGS. 1,2 and 3c.

Figure 3D:
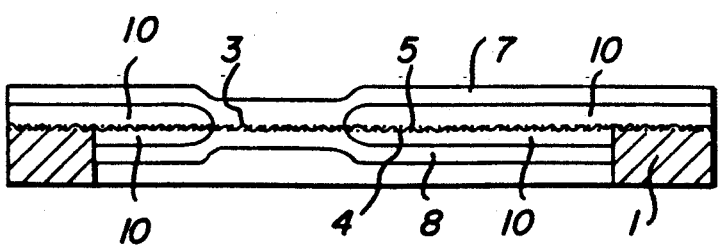

In FIG. 3d, using an emulsion coating device, the inside surface 4 of the screen is coated with a sealing composition 8.

Immediately after the coating is completed, excess sealing composition is removed and disposed of. The screen is rested horizontally, upside down, for 15 to 20 minutes and next the pressure sensitive vinyl sheet 7 is peeled carefully away from the back of the screen. This will remove most of the sealing composition from the image area 3.

A soft, lint free cloth is moistened with vinyl retarder. This moistened cloth is rubbed over the image area on the back of the screen which is examined to see that all of the image has been exposed to the retarder. Next the image is blown out with an air nozzle with a small orifice connected to a compressed air source after which the screen is set to rest horizontally for 24 hours. The screen thus sealed will produce thousands of impressions without failure.

The sealing composition is advantageously prepared from a two part epoxy, consisting of a part of resin and a part of resin hardener in a ratio that depends on the particular type of resin being used and as prescribed by the manufacturer of the resin. In order to insure that the two parts are thoroughly mixed before the use, it is advantageous to add a blue dye to one of the parts and a yellow dye to the other part. The completely mixed parts will be green in color.

Another suitable sealing composition may be composed of air/moisture curing urethane prepolymer, which is red in color for improved visibility.

I claim:

1. Method for preparing a sealed printing screen, having an inside and outside surface, against pinholing, comprising the steps of:
    (a) coating at least one side of the screen with photo emulsion;
    (b) exposing the emulsion to an image to be printed;
    (c) etching out the exposed emulsion;
    (d) applying over the outside surface of the screen to include the image area a sheet of easy releasable pressure-sensitive vinyl;
    (e) coating the inside of the screen with a sealing composition;
    (f) peeling off said pressure-sensitive sheet of vinyl from the screen, which removes most of sealing composition from image area, and
    (g) treating the image area with vinyl retarder.
    (h) blowing out the image area with compress air 2. Method according to claim 1 wherein step (g) further comprises: moistening a cloth with said vinyl retarder and rubbing the cloth over the image area.

3. Method according to claim 1, further comprising: placing the screen in a substantially horizontal position for at least 24 hours for curing of said sealing composition.

4. Method according to claim 1 further comprising, after step (e), carding out excess sealing composition from said screen.

* * * * *